US012666894B2

(12) United States Patent
Ishikawa et al.

(10) Patent No.: US 12,666,894 B2
(45) Date of Patent: Jun. 23, 2026

(54) SUBSTRATE PROCESSING METHOD AND SUBSTRATE PROCESSING APPARATUS

(71) Applicant: Tokyo Electron Limited, Tokyo (JP)

(72) Inventors: Shinya Ishikawa, Miyagi (JP); Kenta Ono, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 216 days.

(21) Appl. No.: 18/374,878

(22) Filed: Sep. 29, 2023

(65) Prior Publication Data

US 2024/0071772 A1 Feb. 29, 2024

Related U.S. Application Data

(63) Continuation of application No. PCT/JP2022/016672, filed on Mar. 31, 2022.

(30) Foreign Application Priority Data

Apr. 1, 2021 (JP) .................................. 2021-062935

(51) Int. Cl.
*H10P 50/00* (2026.01)
*H01J 37/32* (2006.01)
(Continued)

(52) U.S. Cl.
CPC ........ *H10P 50/73* (2026.01); *H01J 37/32899* (2013.01); *H10P 50/283* (2026.01);
(Continued)

(58) Field of Classification Search
None
See application file for complete search history.

(56) References Cited

U.S. PATENT DOCUMENTS 5,994,226 A * 11/1999 Kadomura ........ H01L 21/32139
438/720
7,772,122 B2 * 8/2010 Cirigliano ......... H01L 21/31144
430/313
(Continued)

FOREIGN PATENT DOCUMENTS

JP 2003324146 A 11/2003
JP 2004158538 A 6/2004
(Continued)

OTHER PUBLICATIONS

International Search Report and Written Opinion mailed on Jun. 7, 2022, received for PCT Application PCT/JP2022/016672, filed on Mar. 31, 2022, 9 pages including English Translation.

*Primary Examiner* — Shamim Ahmed
(74) *Attorney, Agent, or Firm* — XSENSUS LLP

(57) ABSTRACT

A substrate processing method according to the present disclosure includes: preparing a substrate having (a) an etching film, (b) a mask film formed on the etching film and having a sidewall that defines an opening on the etching film, and (c) a protective film formed to surround the opening on the sidewall of the mask film and containing an element selected from the group consisting of boron, phosphorus, sulfur, and tin; and etching the etching film by using the protective film and the mask film as a mask.

14 Claims, 6 Drawing Sheets

(51) Int. Cl.

| | | |
|---|---|---|
| *H10P 50/28* | (2026.01) | |
| *H10P 72/00* | (2026.01) | |
| *H10P 74/20* | (2026.01) | |
| *H10P 76/40* | (2026.01) | |

(52) U.S. Cl.
CPC ........ *H10P 50/287* (2026.01); *H10P 72/0421* (2026.01); *H10P 74/203* (2026.01); *H10P 76/405* (2026.01); *H10P 76/4085* (2026.01); *H01J 2237/3341* (2013.01)

(56) References Cited

U.S. PATENT DOCUMENTS

| | | | | |
|---|---|---|---|---|
| 9,543,148 | B1 * | 1/2017 | Hudson | H01J 37/32091 |
| 9,627,218 | B2 * | 4/2017 | Horiguchi | H01L 21/31144 |
| 2006/0264054 | A1 | 11/2006 | Gutsche et al. | |
| 2010/0068885 | A1 * | 3/2010 | Cirigliano | H01L 21/0337 |
| | | | | 257/E21.249 |
| 2019/0062914 | A1 * | 2/2019 | King | C04B 41/81 |
| 2020/0035496 | A1 * | 1/2020 | Kakimoto | C23C 16/52 |
| 2021/0082713 | A1 * | 3/2021 | Katsunuma | H01L 21/31116 |

FOREIGN PATENT DOCUMENTS

| | | | |
|---|---|---|---|
| JP | 2008258624 | A | 10/2008 |
| JP | 2012-227440 | A | 11/2012 |
| JP | 2019110275 | A | 7/2019 |
| JP | 2020-532658 | A | 11/2020 |
| KR | 2009-0104972 | A | 10/2009 |
| KR | 20110065469 | A | 6/2011 |
| KR | 20180101204 | A | 9/2018 |
| KR | 20200034699 | A | 3/2020 |
| WO | 2017090486 | A1 | 6/2017 |
| WO | 2020041213 | A1 | 2/2020 |

* cited by examiner

[FIG. 1]
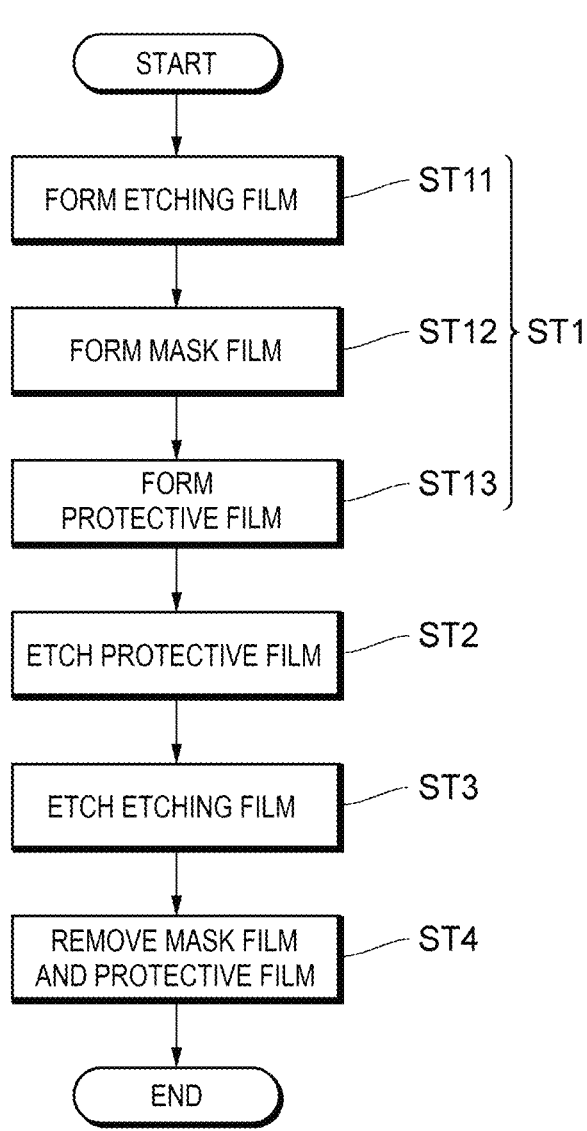

[FIG. 2]
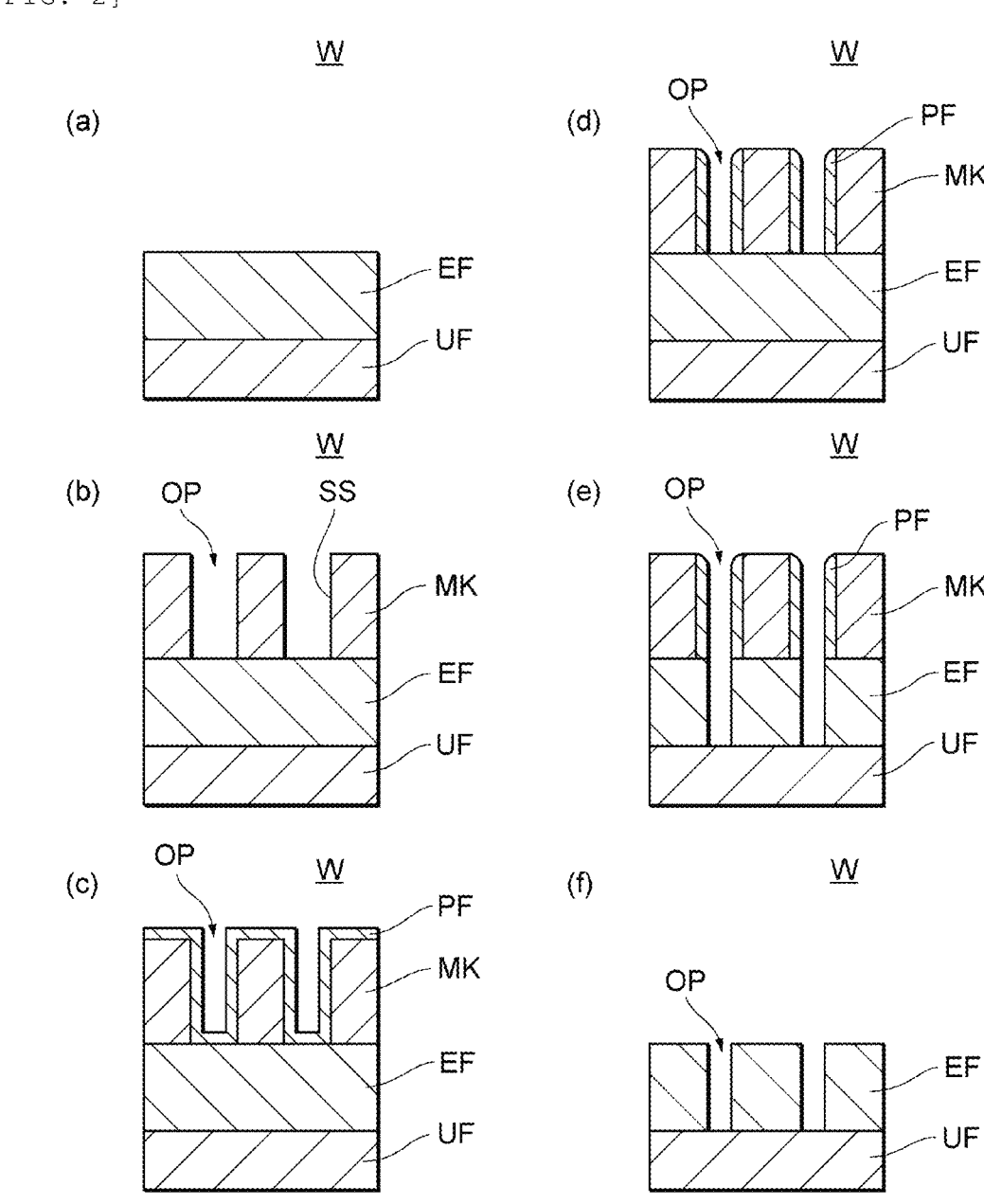

[FIG. 3]
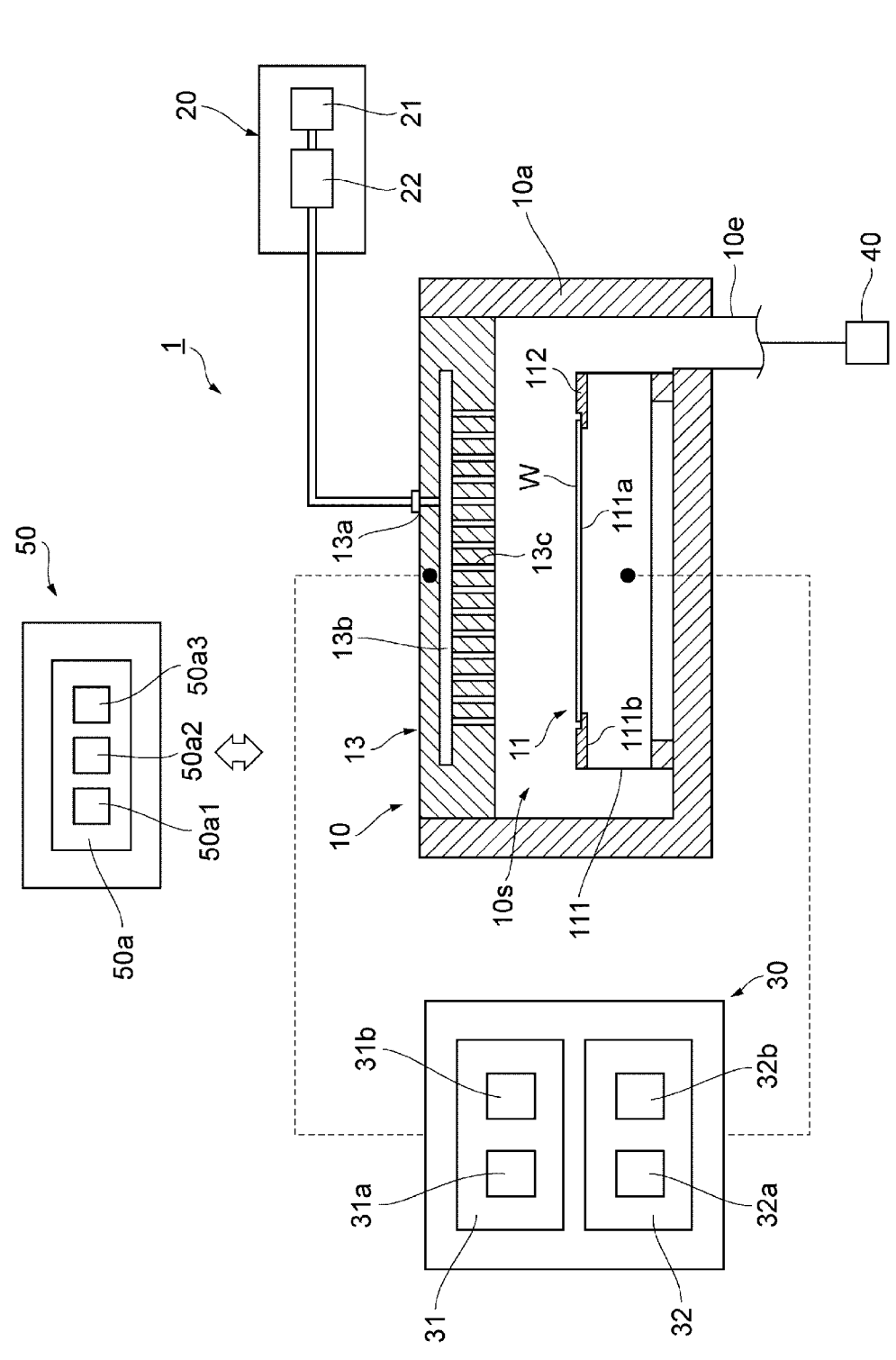

[FIG. 4]
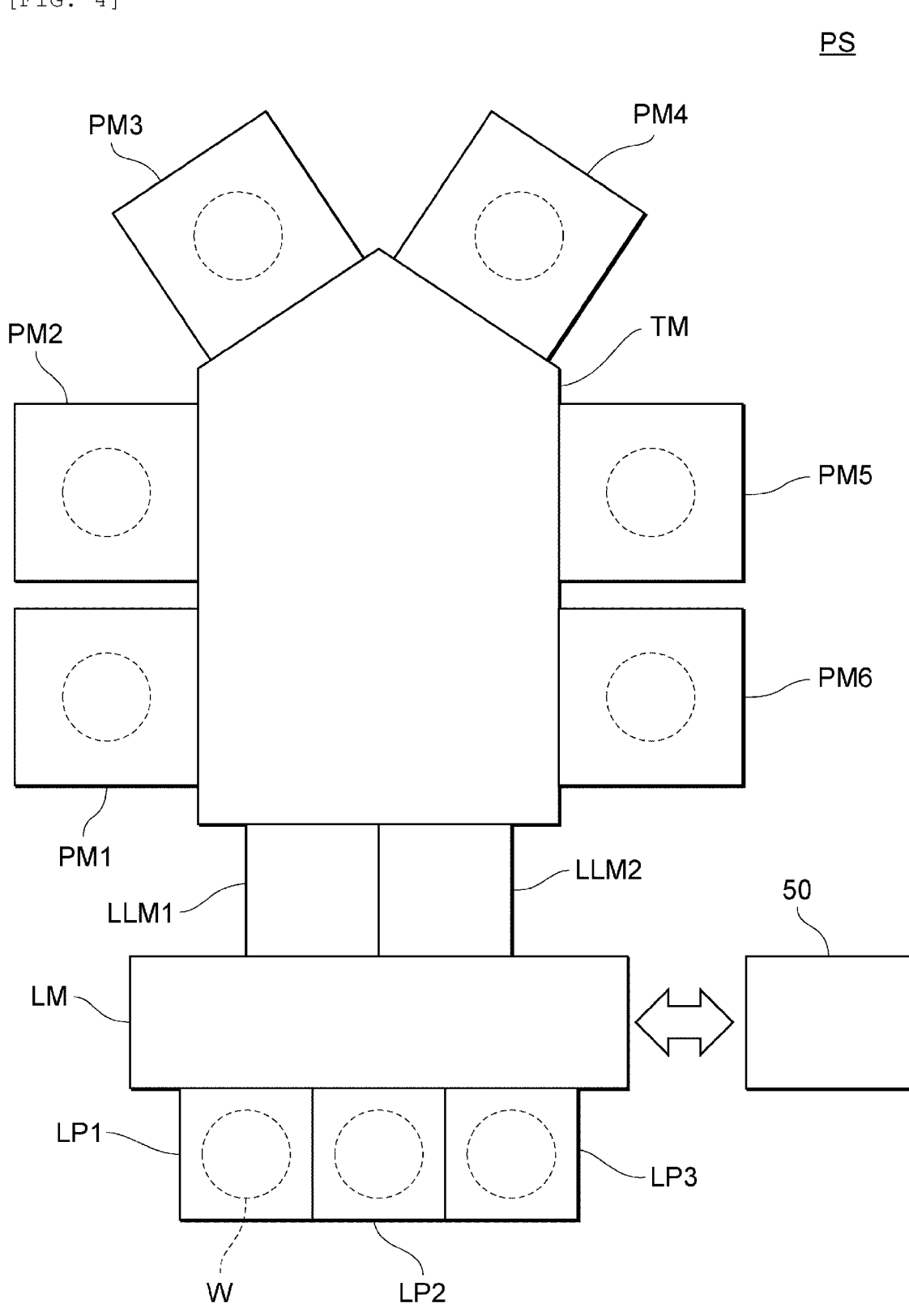

[FIG. 5]
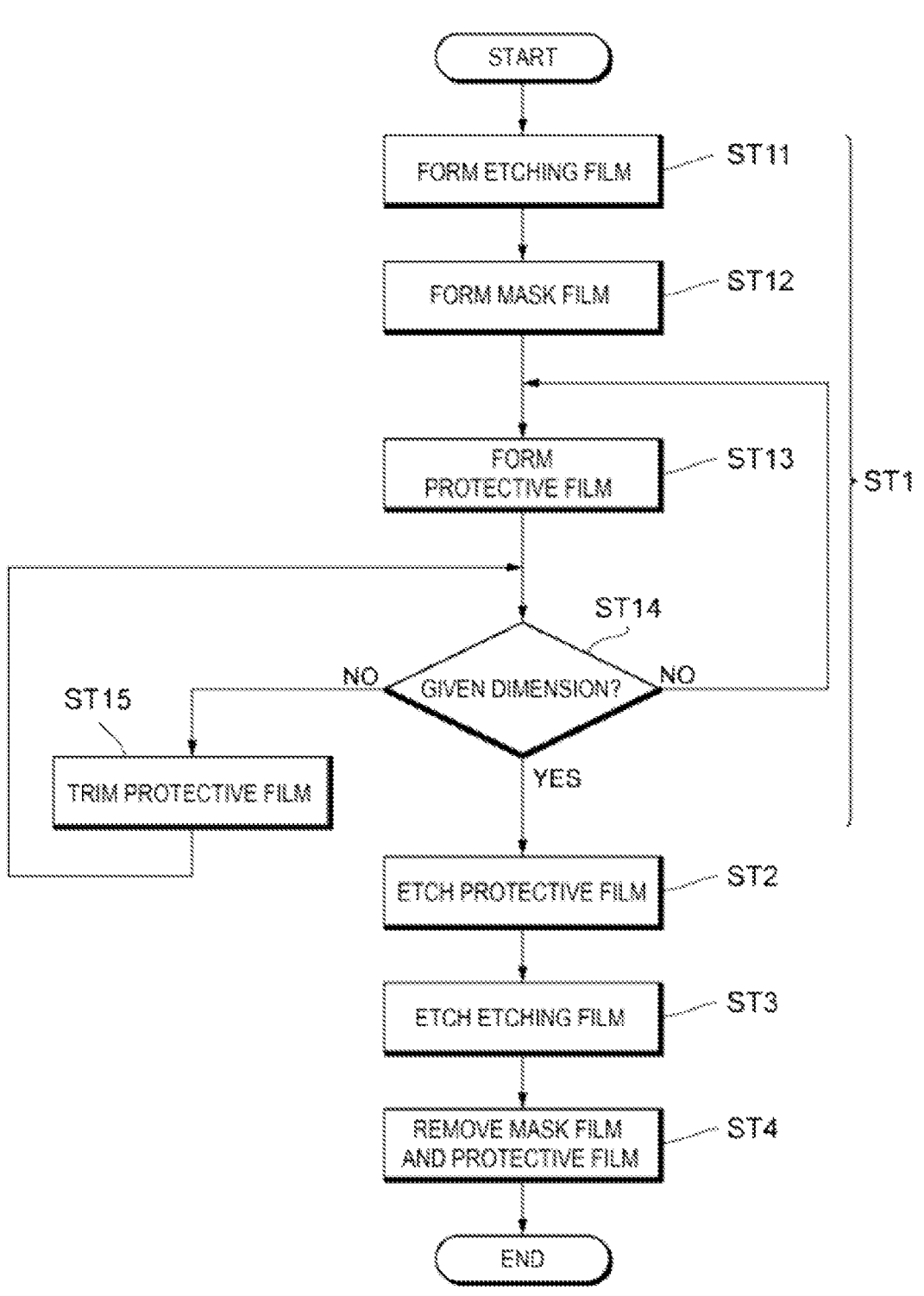

[FIG. 6]
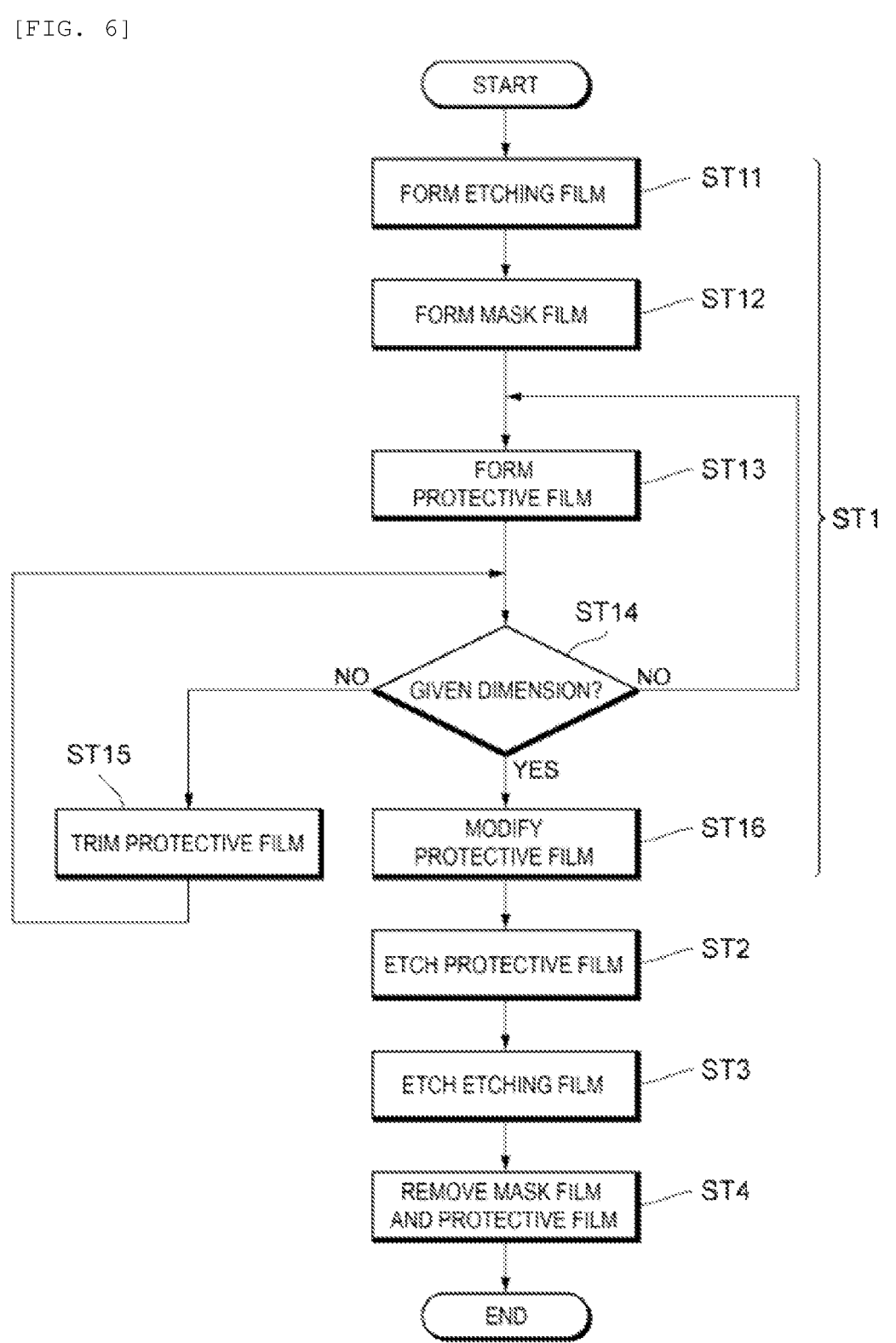

SUBSTRATE PROCESSING METHOD AND SUBSTRATE PROCESSING APPARATUS

TECHNICAL FIELD

Exemplary embodiments of the present disclosure relate to a substrate processing method and a substrate processing apparatus.

BACKGROUND ART

As a technique for making a dimension of a pattern formed on a processing target uniform and improving an LCDU, there is a plasma processing method disclosed in Patent Document 1.

CITATION LIST

Patent Documents

[Patent Document 1] JP2020-017709A

SUMMARY OF INVENTION

Technical Problem

The present disclosure provides a technique for controlling a dimension and/or a shape of an opening formed in an etching film.

Solution to Problem

In one exemplary embodiment of the present disclosure, a substrate processing method is provided. The substrate processing method includes: preparing a substrate having (a) an etching film, (b) a mask film formed on the etching film and having a sidewall that defines at least one opening on the etching film, and (c) a protective film formed to surround the opening on at least the sidewall of the mask film and containing at least one element selected from the group consisting of boron, phosphorus, sulfur, and tin; and etching the etching film by using the protective film and the mask film as a mask.

In one exemplary embodiment of the present disclosure, a substrate processing apparatus is provided. The substrate processing apparatus includes: a plasma processing chamber; a gas supply configured to supply a processing gas to the plasma processing chamber; a power source configured to supply power for generating a plasma in the plasma processing chamber; and a controller, the controller being configured to execute control to dispose a substrate in the plasma processing chamber, the substrate having (a) an etching film, (b) a mask film formed on the etching film and having a sidewall that defines at least one opening on the etching film, and (c) a protective film formed to surround the opening on at least the sidewall of the mask film and containing at least one element selected from the group consisting of boron, phosphorus, sulfur, and tin, supply the processing gas into the plasma processing chamber by the gas supply, generate the plasma in the plasma processing chamber by the power supplied from the power source, and etch the etching film by using the plasma and using the protective film or the protective film and the mask film as a mask.

In one exemplary embodiment of the present disclosure, a substrate processing system is provided. The substrate processing system includes: a first substrate processing apparatus having a first chamber; and a second substrate processing apparatus having a second chamber, in which the first substrate processing apparatus is configured to dispose, in the first chamber, a substrate having (a) an etching film and (b) a mask film formed on the etching film and having a sidewall that defines at least one opening on the etching film, and to form, in the first chamber, (c) a protective film formed to surround the opening on at least the sidewall of the mask film and containing at least one element selected from the group consisting of boron, phosphorus, sulfur, and tin, and the second substrate processing apparatus is configured to dispose, in the second chamber, the substrate on which the protective film is formed, and to etch the etching film in the second chamber by using the protective film or the protective film and the mask film as a mask.

Advantageous Effects of Invention

According to the exemplary embodiments of the present disclosure, a substrate processing method and a substrate processing apparatus that appropriately control a dimension and/or a shape of an opening formed in an etching film can be provided.

BRIEF DESCRIPTION OF DRAWINGS

FIG. 1 a flowchart illustrating a substrate processing method according to an exemplary embodiment.

FIG. 2 a diagram illustrating an example of a cross-sectional structure of a substrate W along a flow of the present processing method.

FIG. 3 a diagram schematically illustrating a substrate processing apparatus according to one exemplary embodiment.

FIG. 4 a diagram illustrating a substrate processing system according to one exemplary embodiment.

FIG. 5 a flowchart illustrating another example of the present processing method.

FIG. 6 a flowchart illustrating still another example of the present processing method.

DESCRIPTION OF EMBODIMENTS

Hereinafter, embodiments of the present disclosure will be described.

In one exemplary embodiment, a substrate processing method is provided. The substrate processing method includes: preparing a substrate having (a) an etching film, (b) a mask film formed on the etching film and having a sidewall that defines at least one opening on the etching film, and (c) a protective film formed to surround the opening on at least the sidewall of the mask film and containing at least one element selected from the group consisting of boron, phosphorus, sulfur, and tin (hereinafter referred to as "at least one protective element" or simply a "protective element"), and etching the etching film by using the protective film and the mask film as a mask.

In one exemplary embodiment, the preparing the substrate includes forming the protective film, measuring one or both of a dimension and a shape of the opening surrounded by the protective film, and trimming a thickness of at least a portion of the protective film formed on the sidewall based on one or both of the dimension and the shape, and the etching the etching film contains etching the etching film by using the mask film and the trimmed protective film as the mask.

In one exemplary embodiment, the preparing the substrate further includes measuring one or both of a dimension and a shape of the opening surrounded by the trimmed protective film.

In one exemplary embodiment, the preparing the substrate further includes one of the forming the protective film and the trimming based on one or both of the dimension and the shape of the opening surrounded by the trimmed protective film.

In one exemplary embodiment, the preparing the substrate includes the forming the protective film, the forming the protective film includes forming a precursor layer on at least the sidewall of the mask film by using a first processing gas, and forming the protective film from the precursor layer by using a second processing gas, and the first processing gas or the second processing gas contains the at least one protective element.

In one exemplary embodiment, the preparing the substrate includes forming the protective film by a CVD method.

In one exemplary embodiment, the preparing the substrate includes forming the protective film, and modifying the protective film such that the protective film contains the at least one protective element more on a surface of the protective film than in an interior of the protective film.

In one exemplary embodiment, the modifying the protective film includes causing the surface of the protective film to react with a processing gas containing the at least one protective element to convert at least the surface of the protective film into a film containing the at least one protective element or a film containing a compound containing the at least one protective element.

In one exemplary embodiment, the preparing the substrate includes modifying the protective film such that the trimmed protective film contains the at least one protective element more on a surface of the protective film than in an interior of the protective film.

In one exemplary embodiment, the modifying the protective film includes causing the surface of the trimmed protective film to react with a processing gas containing the at least one protective element to convert at least the surface of the trimmed protective film into a film containing the at least one protective element or a film containing a compound containing the at least one protective element.

In one exemplary embodiment, the forming the protective film includes forming a carbon containing film or a silicon containing film as the protective film, and the modifying the protective film includes causing a surface of the carbon containing film or the silicon containing film to react with the processing gas containing the at least one protective element to convert the carbon containing film or the silicon containing film into the film containing the at least one protective element or the film containing the compound containing the at least one protective element.

In one exemplary embodiment, the compound containing the at least one protective element is boron oxide, boron nitride, boron carbide, silicon boride, or an organic boron compound.

In one exemplary embodiment, the compound containing the at least one protective element is phosphoric acid, polyphosphoric acid, a phosphate salt, a phosphate ester, a phosphorus oxide, or a phosphorus nitride.

In one exemplary embodiment, the compound containing the at least one protective element is a tin oxide, a tin nitride, a tin phosphide, a tin sulfide, or a tin halide.

In one exemplary embodiment, the opening has a hole shape or a linear shape in a plan view of the substrate.

In one exemplary embodiment, a substrate processing apparatus is provided. The substrate processing apparatus includes: a plasma processing chamber; a gas supply configured to supply a processing gas to the plasma processing chamber; a power source configured to supply power for generating a plasma in the plasma processing chamber; and a controller, the controller being configured to execute control to dispose a substrate in the plasma processing chamber, the substrate having (a) an etching film, (b) a mask film formed on the etching film and having a sidewall that defines at least one opening on the etching film, and (c) a protective film formed to surround the opening on at least the sidewall of the mask film and containing at least one element selected from the group consisting of boron, phosphorus, sulfur, and tin, supply the processing gas into the plasma processing chamber by the gas supply, generate the plasma in the plasma processing chamber by the power supplied from the power source, and etch the etching film by using the plasma and using the protective film or the protective film and the mask film as a mask.

In one exemplary embodiment, a substrate processing system is provided. The substrate processing system includes: a first substrate processing apparatus having a first chamber; and a second substrate processing apparatus having a second chamber, in which the first substrate processing apparatus is configured to dispose, in the first chamber, a substrate having (a) an etching film and (b) a mask film formed on the etching film and having a sidewall that defines at least one opening on the etching film, and to form, in the first chamber, (c) a protective film formed to surround the opening on at least the sidewall of the mask film and containing at least one element selected from the group consisting of boron, phosphorus, sulfur, and tin, and the second substrate processing apparatus is configured to dispose, in the second chamber, the substrate on which the protective film is formed, and to etch the etching film in the second chamber by using the protective film or the protective film and the mask film as a mask.

Hereinafter, each embodiment of the present disclosure will be described in detail with reference to the drawings. In the drawings, the same or similar elements are denoted by the same reference numerals, and overlapping descriptions thereof will be omitted. Unless otherwise specified, a positional relationship of up/down, left/right, or the like will be described based on a positional relationship illustrated in the drawings. The dimensional ratios in the drawings do not indicate actual ratios, and the actual ratios are not limited to the illustrated ratios.

FIG. 1 is a flowchart illustrating a substrate processing method according to one exemplary embodiment (hereinafter, also referred to as the "present processing method"). The present processing method includes a step of preparing a substrate (Step ST1), a step of etching a protective film (Step ST2), a step of etching an etching film (Step ST3), and a step of removing a mask film and the protective film (Step ST4). Step ST1 represents a step of preparing a substrate W. Step ST1 includes Step ST11 (step of forming the etching film), Step ST12 (step of forming the mask film), and Step ST13 (step of forming the protective film).

FIG. 2 is a diagram illustrating an example of a cross-sectional structure of the substrate W along a flow of the present processing method. The (a) of FIG. 2 illustrates a cross-sectional structure of the substrate W after being processed in Step ST11, the (b) of FIG. 2 illustrates a cross-sectional structure of the substrate W after being processed in Step ST12, the (c) of FIG. 2 illustrates a cross-sectional structure of the substrate W after being processed in Step ST13, the (d) of FIG. 2 illustrates a cross-sectional structure of the substrate W after being processed in Step ST2, the (e) of FIG. 2 illustrates a cross-sectional structure of the substrate W after being processed in Step ST3, and the (f) of FIG. 2 illustrates a cross-sectional structure of the substrate W after being processed in Step ST4.

FIG. 3 is a diagram schematically illustrating a substrate processing apparatus according to one exemplary embodiment. In one embodiment, the present exemplary method may be performed by using the substrate processing apparatus.

A substrate processing apparatus 1 is a capacitively coupled plasma processing apparatus. The substrate processing apparatus 1 includes a plasma processing chamber 10, a gas supply 20, a power source 30, an exhaust system 40, and a controller 50. Further, the substrate processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one exemplary embodiment, the shower head 13 constitutes at least a part of a ceiling of the plasma processing chamber 10. The plasma processing chamber 10 has a plasma processing space 10s defined by the shower head 13, a sidewall 10a of the plasma processing chamber 10, and the substrate support 11. The plasma processing chamber 10 has at least one gas supply port for supplying at least one processing gas into the plasma processing space 10s, and at least one gas exhaust port for exhausting the gas from the plasma processing space. The sidewall 10a is grounded. The shower head 13 and the substrate support 11 are electrically insulated from a housing of the plasma processing chamber 10.

The substrate support 11 includes a main body 111 and a ring assembly 112. The main body 111 has a central region (substrate support surface) 111a for supporting the substrate (wafer) W, and an annular region (ring support surface) 111b for supporting the ring assembly 112. The annular region 111b of the main body 111 surrounds the central region 111a of the main body 111 in a plan view. The substrate W is disposed on the central region 111a of the main body 111 and the ring assembly 112 is disposed on the annular region 111b of the main body 111 to surround the substrate W on the central region 111a of the main body 111. In one exemplary embodiment, the main body 111 includes a base and an electrostatic chuck. The base includes a conductive member. The conductive member of the base functions as a lower electrode. The electrostatic chuck is disposed on the base. The upper surface of the electrostatic chuck has a substrate support surface 111a. The ring assembly 112 includes one or more annular members. At least one of the one or more annular members is an edge ring. Although not illustrated, the substrate support 11 may include a temperature control module configured to adjust a temperature of at least one of the electrostatic chuck, the ring assembly 112, and the substrate W to a target temperature. The temperature control module may include a heater, a heat transfer medium, a flow path, or a combination thereof. A heat transfer fluid, such as brine or gas, flows through the flow path. The substrate support 11 may further include a heat transfer gas supply configured to supply a heat transfer gas between a rear surface of the substrate W and the substrate support surface 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. The gas introduction unit may include, in addition to the shower head 13, one or a plurality of side gas injectors (SGI) that are attached to one or a plurality of openings formed in the sidewall 10a.

The gas supply 20 may include at least one gas source 21 and at least one flow rate controller 22. In one exemplary embodiment, the gas supply 20 is configured to supply at least one processing gas from the corresponding gas source 21 to the shower head 13 via the corresponding flow rate controller 22. Each flow rate controller 22 may include, for example, a mass flow controller or a pressure-controlled flow rate controller. The gas supply 20 may further include one or more flow rate modulation devices that modulate or pulse a flow rate of the at least one processing gas.

The power source 30 includes an RF power source 31 coupled to the plasma processing chamber 10 via at least one impedance matching circuit. The RF power source 31 is configured to supply at least one RF signal (RF power), such as a source RF signal and a bias RF signal, to the conductive member of the substrate support 11 and/or the conductive member of the shower head 13. Accordingly, plasma is formed from at least one processing gas supplied into the plasma processing space 10s. Accordingly, the RF power source 31 may function as at least a portion of a plasma generator configured to generate plasma from one or more processing gases in the plasma processing chamber 10. Further, supplying of the bias RF signal to the conductive member of the substrate support 11 can generate a bias potential in the substrate W to draw an ion component in the formed plasma to the substrate W.

In one exemplary embodiment, the RF power source 31 includes a first RF generator 31a and a second RF generator 31b. The first RF generator 31a is coupled to the conductive member of the substrate support 11 and/or the conductive member of the shower head 13 via at least one impedance matching circuit, and configured to generate a source RF signal (source RF power) for plasma generation. In one exemplary embodiment, the source RF signal has a frequency in a range of 13 MHz to 150 MHz. In one exemplary embodiment, the first RF generator 31a may be configured to generate source RF signals having different frequencies. The generated one or a plurality of source RF signals are supplied to the conductive member of the substrate support 11 and/or the conductive member of the shower head 13. The second RF generator 31b is coupled to the conductive member of the substrate support 11 via at least one impedance matching circuit, and configured to generate a bias RF signal (bias RF power). In one exemplary embodiment, the bias RF signal has a frequency smaller than that of the source RF signal. In one exemplary embodiment, the bias RF signal has a frequency in a range of 400 kHz to 60 MHz. In one exemplary embodiment, the second RF generator 31b may be configured to generate bias RF signals having different frequencies. The generated one or more bias RF signals are supplied to the conductive member of the substrate support 11. Further, in various embodiments, at least one of the source RF signal and the bias RF signal may be pulsed.

The power source 30 may further include a DC power source 32 coupled to the plasma processing chamber 10. The DC power source 32 includes a first DC generator 32a and a second DC generator 32b. In one exemplary embodiment, the first DC generator 32a is configured to be connected to the conductive member of the substrate support 11 and to generate a first DC signal. The generated first bias DC signal is applied to the conductive member of the substrate support 11. In one exemplary embodiment, the first DC signal may be applied to another electrode, such as an electrode in the electrostatic chuck. In one exemplary embodiment, the second DC generator 32b is configured to be connected to the conductive member of the shower head 13 and to generate a second DC signal. The generated second DC signal is applied to the conductive member of the shower head 13. In various embodiments, at least one of the first and second DC signals may be pulsed. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

The controller 50 processes computer-executable instructions for instructing the substrate processing apparatus 1 to execute various steps described in the present disclosure. The controller 50 may be configured to control each element of the substrate processing apparatus 1 to execute the various steps described herein below. In one exemplary embodiment, a part or entire of the controller 50 may be provided as a part of a configuration of an apparatus external to the substrate processing apparatus 1. The controller 50 may include, for example, a computer 50a. For example, the computer 50a may include a processor (central processing unit (CPU)) 50a1, a storage 50a2, and a communication interface 50a3. The processor 50a1 may be configured to perform various control operations based on a program stored in the storage 50a2. The storage 50a2 may include a random access memory (RAM), a read only memory (ROM), a hard disk drive (HDD), a solid state drive (SSD), or a combination thereof. The communication interface 50a3 may communicate with other configurations of the substrate processing apparatus 1 via a communication line such as a local area network (LAN).

FIG. 4 shows a substrate processing system according to one exemplary embodiment. In one embodiment, the present exemplary method may be executed by using the substrate processing system.

A substrate processing system PS includes substrate processing modules PM1 to PM6 (hereinafter, also collectively referred to as a "substrate processing module PM"), a transfer module TM, load lock modules LLM1 and LLM2 (hereinafter, also collectively referred to as a "load lock module LLM"), a loader module LM, and load ports LP1 to LP3 (hereinafter, also collectively referred to as a "load port LP"). The controller 50 controls each configuration of the substrate processing system PS to execute a given process on the substrate W.

The substrate processing modules PM1 to PM6 execute a process such as an etching process, a trimming process, a film formation process, an annealing process, a doping process, a lithography process, a cleaning process, and an ashing process on the substrate W therein. A part of the substrate processing module PM may be a measurement module, and may measure a film thickness of a film formed on the substrate W, a dimension of a pattern formed on the substrate W, or the like. The substrate processing apparatus 1 illustrated in FIG. 3 is an example of the substrate processing module PM.

The transfer module TM includes a transfer device that transfers the substrate W. and transfers the substrate W between the substrate processing modules PM or between the substrate processing module PM and the load lock module LLM. The substrate processing module PM and the load lock modules LLM are disposed adjacent to the transfer module TM. The transfer module TM, and the substrate processing module PM and the load lock module LLM are spatially separated or connected by openable and closable gate valves.

The load lock modules LLM1 and LLM2 are provided between the transfer module TM and the loader module LM. The load lock module LLM can switch a pressure therein to an atmospheric pressure or a vacuum. The load lock module LLM transfers the substrate W from the loader module LM which is at the atmospheric pressure to the transfer module TM which is at a vacuum, and transfers the substrate W from the transfer module TM which is at a vacuum to the loader module LM which is at the atmospheric pressure.

The loader module LM includes a transfer device that transfers the substrate W, and transfers the substrate W between the load lock module LLM and the load port LP. For example, a front opening unified pod (FOUP) in which 25 substrates W can be accommodated or an empty FOUP can be placed in the load port LP. The loader module LM takes the substrate W out from the FOUP in the load port LP and transfers the substrate W to the load lock module LLM. Further, the loader module LM takes the substrate W out from the load lock module LLM and transfers the substrate W to the FOUP in the load port LP.

The controller 50 controls each configuration of the substrate processing system PS to execute a given process on the substrate W. The controller 50 stores a recipe in which a process procedure, a process condition, a transfer condition, and the like are set, and controls each configuration of the substrate processing system PS to execute a given process on the substrate W according to the recipe.

Hereinafter, an example of the present processing method illustrated in FIG. 1 will be described with reference to FIG. 2 to FIG. 4. The process in each step may be executed in the substrate processing module PM (see FIG. 4) of the substrate processing system PS. The etching process in each step may be executed in the substrate processing apparatus 1 illustrated in FIG. 3. The process in one step of the present processing method may be executed in one module of the substrate processing modules PM, and the process in another step of the present processing method may be performed in another module of the substrate processing modules PM. The processes in steps of the present processing method may be consecutively executed in one module of the substrate processing modules PM.

In Step ST11, an etching film EF is formed on an underlying film UF (see the (a) of FIG. 2). The underlying film UF is, for example, a dielectric film, a metal film, or a semiconductor film formed on a silicon wafer. The etching film EF is, for example, an organic film or a dielectric film.

The organic film is, for example, a spin-on-carbon (SOC) film, a photoresist film, or amorphous carbon. The dielectric film is, for example, a silicon oxide film, a silicon nitride film, SiARC, or SiON. The underlying film UF and/or the etching film EF may be formed by a CVD method, an ALD method, a spin coating method, or the like. The underlying film UF and/or the etching film EF may be a flat film or may be an uneven film.

In Step ST12, a mask film MK is formed on the etching film EF (see the (b) of FIG. 2). The mask film MK is formed to have at least one sidewall SS defining at least one opening OP on the etching film EF. The opening OP is a space on the etching film EF and is surrounded by the sidewall SS. That is, in the (b) of FIG. 2, the etching film EF has a region covered with the mask film MK and a region exposed at a bottom of the opening OP.

The opening OP may have any shape in a plan view of the substrate W (when the substrate W is viewed in a direction from above to below in FIG. 2). The shape may be, for example, a hole shape such as an ellipse or a rectangle or a linear shape, or a combination of the hole shape and the linear shape. The mask film MK may have sidewalls SS, and the sidewalls SS may define openings OP. The plurality of openings OP may each have a linear shape, and may be arranged at regular intervals to form a line and space pattern. Further, the plurality of openings OP may each have a hole shape and may form an array pattern.

The mask film MK is, for example, an organic film, a dielectric film, or a metal containing film. The organic film is, for example, a spin-on-carbon (SOC) film, a photoresist film, or amorphous carbon. The dielectric film is, for example, a silicon oxide film, a silicon nitride film, SiARC, or SiON. The metal containing film is, for example, a film composed of Sn, Zr, Hf, Ta, Ti, Al, Y, La, W, Mo, Ni, Ru, In, and Co, or an oxide, a nitride, a silicate, or an oxynitride thereof. The mask film MK may be formed by a CVD method, an ALD method, a spin coating method, or the like. The opening OP may be formed by etching the mask film MK, or may be formed by performing lithography on the mask film MK.

In Step ST13, a protective film PF is formed on the mask film MK and the etching film EF (see the (c) of FIG. 2). The protective film PF is formed on the sidewall SS of the mask film MK to surround the opening OP. Accordingly, a dimension of the opening OP in a width direction (a left-right direction in FIG. 2) is adjusted. Further, the protective film PF is formed to cover the exposed etching film EF at the bottom of the opening OP. Accordingly, a dimension of the opening OP in a depth direction (an up-down direction in FIG. 2) is adjusted. In another example, a condition for forming the protective film PF may be adjusted to selectively form the protective film PF on the mask film MK. That is, the protective film PF may be formed on the mask film MK such that the etching film EF is exposed at the bottom of the opening OP.

The protective film PF is a film containing at least one protective element selected from the group consisting of boron, phosphorus, sulfur, and tin (a compound containing the "at least one protective element" is referred to as a "protective element compound"). The protective film PF may be a film formed of the protective element or the protective element compound. The protective film PF may be formed by growing the protective element or the protective element compound by an ALD method or a CVD method.

When the protective film PF is formed by the ALD method, the protective film PF is formed by the following steps. First, the first processing gas is introduced into a film forming apparatus (a substrate processing apparatus/module that performs the film formation process), and a precursor layer is formed from a substance contained in the first processing gas on surfaces of the mask film MK and the etching film EF. Then, the second processing gas is introduced into the film forming apparatus, and a substance contained in the second processing gas reacts with the precursor layer formed on the surfaces of the mask film MK and/or the etching film EF. The second processing gas is a gas that reacts with the precursor layer formed from the first processing gas to form the protective element compound. Accordingly, a film of the protective element compound is formed on the surfaces of the mask film MK and the etching film EF. By repeating these steps, the protective element compound is grown to a desired thickness, and the protective film PF is formed. After the precursor layer is formed on the surfaces of the mask film MK and/or the etching film EF, the second processing gas may be introduced into the film forming apparatus after an unnecessary gas is purged.

In the ALD method, the conformal protective film PF can be formed on the surfaces of the mask film MK and the etching film EF. However, as described above, it is also possible to do at the bottom of the opening OP by adjusting the condition for forming the protective film PF. For example, by forming the protective film PF under a condition that satisfies at least one of the following (a) and (b), the protective film PF can be formed on the mask film MK such that the etching film EF is exposed.

(a) The introduction of the first processing gas is stopped before the precursor layer is formed on the entire surfaces of the mask film MK and the etching film EF.

(b) The introduction of the second processing gas is stopped before the reaction of the substance contained in the second processing gas with the precursor layer formed on the entire surface of the mask film MK and/or the etching film EF is completed.

When the protective film PF is formed by the CVD method, the protective film PF is formed by the following steps. First, the first processing gas and the second processing gas are introduced into the film forming apparatus. Then, energy (for example, plasma energy or thermal energy) is applied to the first processing gas and the second processing gas to cause the first processing gas to react with the second processing gas. Accordingly, the protective element or the protective element compound is deposited on the surfaces of the mask film MK and the etching film EF. Then, the protective element or the protective element compound is deposited to a desired thickness to form the protective film PF. As the energy applied to the first processing gas and the second processing gas, in addition to the thermal energy and the plasma energy, light energy such as an electron beam, ultraviolet rays (UV), extreme ultraviolet rays (EUV), an Ar/KrF laser may be used.

The protective film PF may be formed, by the ALD method, a sub-conformal ALD method, or the CVD method, in the substrate processing apparatus/module that performs the etching process. The substrate processing apparatus may be a substrate processing apparatus that etches the protective film in Step ST2.

When the protective element is boron, the protective element compound is, for example, boron oxide, boron nitride, boron carbide, silicon boride, or an organic boron compound. Further, when the protective element is boron, the first processing gas may be a gas containing a boron containing substance. The second processing gas may be a gas containing a hydrogen containing substance (for example, $H_2$ and $H_2O$), an oxygen containing substance (for example, $O_2$, $O_3$, CO, and $CO_2$), a nitrogen containing substance (for example, $N_2$, NO, $NH_3$, and another inorganic compound having an N—H bond), a carbon containing substance, a silicon containing substance, a boron containing substance, or a noble gas. The boron containing substance contained in the first processing gas and the boron containing substance contained in the second processing gas may be, for example, a borane compound (for example, borane, diborane, trimethylborane, trimethoxyborane, triphenylborane, boron trifluoride ($BF_3$), boron trichloride ($BCl_3$), boron tribromide ($BBr_3$), and boron triiodide ($BI_3$)), a borane complex (for example, ammonia borane, a borane-tetrahydrofuran complex, a borane-dimethylamine complex, and a borane-pyridine complex), a borate ester (for example, boric acid, tripropyl borate, trimethyl borate, triphenyl borate, and tris(hexafluoroisopropyl) borate), a borazine compound (for example, borazine, trichloroborazine, triethylborane, and hexamethylborazine), a boroxine compound (for example, boroxine, trimethylboroxine, and trimethoxyboroxine), a boronic acid (for example, boronic acid, methylboronic acid, phenylboronic acid, cyclohexylboronic acid, p-phenylenediboronic acid, and tetrahydroxydiboronic acid), a borinic acid (for example, borinic acid, diethylborinic acid, diphenylborinic acid, and p,p'-ditolylborinic acid), a boronate ester (for example, dibutyl vinyl boronate, bis[(pinacolato)boryl] methane, and 4-acetoxyphenylboronic acid pinacol), and a borinate ester (for example, 2-aminoethyldiphenyl borinate). When the first processing gas contains the boron containing substance and the second processing gas contains the carbon containing material such as a hydrocarbon or a fluorocarbon, the protective film PF may be formed from a boron-doped carbon containing material. When the first processing gas contains the boron containing substance and the second processing gas contains the silicon containing substance, the protective film PF may be formed from a boron-doped silicon containing material.

When the protective element is phosphorus, the protective element compound is, for example, phosphoric acid, polyphosphoric acid, a phosphate salt, a phosphate ester, a phosphorus oxide, or a phosphorus nitride. The phosphate salt is, for example, calcium dihydrogen phosphate or tin diphosphate. The phosphorus oxide is, for example, tetraphosphorus decaoxide. Further, when the protective element is phosphorus, the first processing gas may be a gas containing a phosphorus containing substance. The second processing gas may be a gas containing $H_2O$, an inorganic compound having an N—H bond, a carbon containing substance, a silicon containing substance, or a phosphorus containing substance. The phosphorus containing substance contained in the first processing gas and the phosphorus containing substance that may be contained in the second processing gas may be a phosphoryl compound, a phosphine substance, a phosphorane compound, a phosphaalkene compound, a phosphaalkyne compound, or a phosphazene compound. The phosphoryl compound is, for example, phosphoryl chloride, trimethyl phosphate (($CH_3O)_3PO$), triethyl phosphate (($C_2H_5O)_3PO$), hexamethylphosphoric triamide (($N(CH_3)_2)_3PO$), or diphenylphosphoryl chloride. The phosphine substance is, for example, phosphine, phosphorus trifluoride, phosphorus trichloride, or phosphorus tribromide. The phosphine substance may be $P_x(C_yH_z)_n$. Here, x, y, z, and n are each an integer of 1 or more. $P_x(C_yH_z)_n$ is, for example, trimethylphosphine. Alternatively, the phosphine substance is trimethoxylphosphine ($P(OCH_3)_3$), tris(dimethylamino)phosphine ($P(N(CH_3)_2)_3$), or tris(trimethylsilyl) phosphine ($P(Si(CH_3)_3$). The phosphorane compound is, for example, phosphorus pentafluoride or phosphorus pentachloride. The phosphaalkene compound is, for example, phosphaethene or phosphorine. The phosphaalkyne compound is, for example, phosphaethyne or adamantylphosphaethyne. The phosphazene compound is, for example, hexafluorocyclotriphosphazene or hexaphenoxycyclotriphosphazene. The inorganic compound with an N—H bond may be ammonia ($NH_3$), diazene ($N_2H_2$), hydrazine ($N_2H_4$), or an amine. The amine is, for example, dimethylamine or ethylenediamine. The carbon containing substance may be a hydrocarbon, a fluorocarbon, an organic compound with a hydroxyl group, a carboxylic acid, a carboxylic anhydride, or a carboxylic halide. The hydrocarbon is, for example, methane or propylene. The fluorocarbon is, for example, $CF_4$ or $C_4F_6$. The organic compound having a hydroxyl group is, for example, alcohols such as methanol and ethylene glycol or phenols. The carboxylic acid is, for example, acetic acid or oxalic acid. The silicon containing substance is, for example, silicon chloride or aminosilane. The phosphorus containing substance contained in the first processing gas and the phosphorus containing substance that may be contained in the second processing gas may be the same as or different from each other. When the first processing gas and the second processing gas contain the same phosphorus containing substance, a plasma formed from either the first processing gas or the second processing gas is used.

Further, when the first processing gas contains the phosphorus containing substance and the second processing gas contains $H_2O$, the protective film PF may be formed from phosphoric acid. When the first processing gas contains the phosphorus containing substance and the second processing gas contains an organic compound having a hydroxy group, a carboxylic acid, a carboxylic anhydride, or a carboxylic halide, the protective film PF may be formed from a phosphate ester. When the first processing gas contains the phosphorus containing substance and the second processing gas contains the inorganic compound having an N—H bond, the protective film PF may be formed from a phosphorus nitride or phosphoric triamide. When the first processing gas contains the phosphorus containing substance and the second processing gas contains the phosphorus containing substance, the protective film PF may be formed from phosphoric acid, a phosphorus oxide, or a phosphorus nitride. When the first processing gas contains the phosphorus containing substance and the second processing gas contains the carbon containing substance such as a hydrocarbon or a fluorocarbon, the protective film PF may be formed from a phosphorus-doped carbon containing material. When the first processing gas contains the phosphorus containing substance and the second processing gas contains the silicon containing substance, the protective film PF may be formed from a phosphorus-doped silicon containing material.

Further, the first processing gas may contain the above-described carbon containing substance or the above-described silicon containing substance, and the second processing gas may contain the above-described phosphorus containing substance. When the first processing gas contains the carbon containing substance such as a hydrocarbon or a fluorocarbon and the second processing gas contains the phosphorus containing substance, the protective film PF may be formed from the phosphorus-doped carbon containing material. When the first processing gas contains the silicon containing substance and the second processing gas contains the phosphorus containing substance, the protective film PF may be formed from the phosphorus-doped silicon containing material.

Further, the first processing gas may contain the above-described phosphorus containing substance, and the second processing gas may contain at least one of $H_2$, $O_2$, and $N_2$. In this case, the protective film PF may be formed by supplying chemical species from the plasma generated from the second processing gas to the precursor layer. When the first processing gas contains the phosphorus containing substance and the second processing gas contains $H_2$ and $O_2$, the protective film PF may be formed from phosphoric acid. When the first processing gas contains the phosphorus containing substance and the second processing gas contains $N_2$ and $H_2$, the protective film PF may be formed from a phosphorus nitride. When the first processing gas contains the phosphorus containing substance and the second processing gas contains $H_2$, the protective film PF may be formed from phosphorus.

When the protective element is sulfur, the protective element compound is, for example, a compound containing a thiourea bond, a compound containing a sulfonamide bond, a compound containing a sulfonate ester bond, a compound containing a thiourethane bond, a compound containing a sulfide bond, a polythiophene, or a sulfur-doped silicon compound. The first processing gas may contain a sulfur containing substance, and the second processing gas may contain $H_2O$, an inorganic compound having an N—H bond, the carbon containing substance, the silicon containing substance, or the sulfur containing substance. The sulfur containing substance contained in the first processing gas and the sulfur containing substance that may be contained in the second processing gas may be an isothiocyanate compound, a sulfonyl compound, a thiol compound, a thiophene compound, an episulfide compound, a disulfide compound, a sulfide compound, a thiocarbonyl compound, or a sulfide gas. The isothiocyanate compound is, for example, phenyl isothiocyanate, isothiocyanatotrimethylsilane, tolylene diisothiocyanate, or 1,4-butane diisothiocyanate. The sulfonyl compound is, for example, benzenesulfonyl chloride, bis-trichloromethyl sulfone, or 1,3-benzenedisulfonyl fluoride. The thiol compound is, for example, methanethiol, allyl mercaptan, 1,2-ethanediol, or 1,3-benzenedithiol. The thiophene compound is, for example, thiophene, 2-thiophenecarboxylic acid, or 3-phenylthiophene. The episulfide compound is, for example, ethylene sulfide or propylene sulfide. The disulfide compound is, for example, diethyl disulfide or diphenyl disulfide. The sulfide compound is, for example, dimethyl sulfide or tetrahydrothiophene. The thiocarbonyl compound is, for example, di-tert-butylthioketone, thioacrolein, or dithioacetic acid. The sulfide gas is, for example, sulfur dioxide, carbon disulfide, carbonyl sulfide, or hydrogen sulfide. The inorganic compound having an N—H bond is, for example, ammonia ($NH_3$), diazene ($N_2H_2$), hydrazine ($N_2H_4$), or an amine. The amine is, for example, dimethylamine or ethylenediamine. The carbon containing substance is, for example, a hydrocarbon, a fluorocarbon, an organic compound having a hydroxy group, a carboxylic acid, a carboxylic anhydride, or a carboxylic halide. The hydrocarbon is, for example, an alkene compound such as methane or propylene. The fluorocarbon is, for example, $CF_4$ or $C_4F_6$. The organic compound having a hydroxyl group is, for example, alcohols such as methanol and ethylene glycol or phenols. The carboxylic acid is, for example, acetic acid or oxalic acid. The silicon containing substance is, for example, silicon chloride or aminosilane. The sulfur containing substance contained in the first processing gas and the sulfur containing substance that may be contained in the second processing gas may be the same as or different from each other. When the first processing gas and the second processing gas contain the same sulfur containing substance, a plasma formed from either the first processing gas or the second processing gas is used.

Further, the first processing gas may contain the above-described carbon containing substance or the above-described silicon containing substance, and the second processing gas may contain the above-described sulfur containing substance. Further, the first processing gas may contain the above-described sulfur containing substance, and the second processing gas may contain at least one of $H_2$, $O_2$, and $N_2$. In this case, the protective film PF may be formed by supplying chemical species from the plasma generated from the second processing gas to the precursor layer.

When the protective element is tin, the protective element compound is, for example, a film containing metal tin as a main component, a film containing a tin oxide ($SnO_x$) as a main component, a film containing a tin hydroxide ($Sn(OH)_x$) as a main component, a film containing a tin nitride ($Sn_xN_y$) as a main component, a film containing a tin phosphide ($Sn_xP_y$) as a main component, a film containing a tin sulfide ($SnS_x$) as a main component, or a film containing a tin halide as a main component. Here, each of "x" and "y" is an integer of 1 or more. The tin oxide is, for example, $SnO_2$ or SnO. The tin nitride is, for example, SnN or $Sn_3N_4$. The tin phosphide is, for example, $P_2Sn_3$. The tin sulfide is, for example, SnS or $SnS_2$. The tin halide is, for example, $SnF_4$, $SnCl_2$, $SnBr_2$ or $SnI_2$. Further, when the protective element is tin, at least one of the first processing gas and the second processing gas contains a tin containing substance. The other of the first processing gas and the second processing gas may contain $H_2O$, $H_2O_2$, $O_3$, $N_2O_4$, an inorganic compound containing nitrogen, an inorganic compound containing sulfur, a halogen compound, a carbon containing substance, a silicon containing substance, or the tin containing substance. In this case, the other of the first processing gas and the second processing gas may be used without generating a plasma, or a plasma may be generated from the other of the first processing gas and the second processing gas. Alternatively, the other of the first processing gas and the second processing gas may contain at least one of $N_2$ and an oxygen containing substance. In this case, chemical species from the plasma generated from the other of the first processing gas and the second processing gas may be supplied to a precursor layer that contains tin atoms and that is formed on a surface of the substrate W. The oxygen containing substance may be $O_2$, NO, or $CO_2$.

The tin containing substance is, for example, a stannane compound, an oxygen containing tin compound, a nitrogen containing tin compound, a phosphorus containing tin compound, or a tin halide compound.

The stannane compound is, for example, stannane, tetramethylstannan, tributylstannan, phenyltrimethylstannan, tetravinylstannan, dimethyldichlorostannan, butyltrichlorostannan, or trichlorophenylstannan.

The oxygen containing tin compound is, for example, tributyltin methoxide, tin tert-butoxide, dibutyltin diacetate, triphenyltin acetate, tributyltin oxide, triphenyltin acetate, triphenyltin hydroxide, butylchlorotin dihydroxide, or acetylacetonatotin.

The nitrogen containing tin compound is, for example, dimethylaminotrimethyltin, tris(dimethylamino)tert-butyltin, azidotrimethyltin, tetrakis(dimethylamino)tin, or azidotrimethyltin.

The tin halide compound is, for example, tin chloride, tin bromide, tin iodide, dimethyltin dichloride, butyltin trichloride, or phenyltin trichloride. The tin halide compound may be tetravalent tin chloride, tin bromide, or tin iodide. Tetravalent tin chloride, tin bromide, and tin iodide have low melting points, and therefore may be used to form a precursor layer from which the protective film PF is formed. Meanwhile, tetravalent tin fluoride and divalent tin halide have high melting points, and therefore may be used as a material constituting the protective film PF.

The inorganic compound containing nitrogen that may be contained in the other of the first processing gas and the second processing gas is, for example, $NH_3$ or $N_2O_4$. The inorganic compound containing sulfur that may be contained in the other of the first processing gas and the second processing gas is, for example, $H_2S$, $SO_2$, COS, or $CS_2$. The halogen compound that may be contained in the other of the first processing gas and the second processing gas is, for example, $CF_4$, $F_2$, or $CCl_4$. The carbon containing substance that may be contained in the other of the first processing gas and the second processing gas is, for example, a hydrocarbon, a fluorocarbon, an organic compound having a hydroxy group, a carboxylic acid, a carboxylic anhydride, or a carboxylic halide. The hydrocarbon is, for example, methane or propylene. The fluorocarbon is, for example, $CF_4$ or $C_4F_6$. The organic compound having a hydroxyl group is, for example, alcohols such as methanol and ethylene glycol or phenols. The carboxylic acid is, for example, acetic acid or oxalic acid. The silicon containing substance is, for example, silicon chloride or aminosilane.

The protective film PF may be formed to have a thickness different in a central portion and a peripheral portion of the substrate W in the plan view of the substrate W. For example, the protective film PF may be formed in a state where energy (for example, a temperature or a plasma) in the substrate W is different in the central portion and the peripheral portion. Accordingly, even when the dimension of the opening OP in the mask film MK is different in the central portion and the peripheral portion of the substrate W, a distribution of the thickness of the protective film PF can be appropriately controlled to correct a deviation in the dimension.

In Step ST2, the protective film PF is etched (see the (d) of FIG. 2). In the present embodiment, the protective film PF is anisotropically etched in the depth direction of the opening OP (a direction from a top to a bottom in FIG. 2). The protective film PF is etched such that the etching film EF is exposed at the bottom of the opening OP. The protective film PF may be etched by a method of selectively etching the protective film PF with respect to the etching film EF. Further, the substrate W may have a stopper film between the etching film EF and the mask film MK, and the protective film PF may be etched by a method of selectively etching the protective film PF with respect to the stopper film.

The protective film PF may be etched such that a portion of the mask film MK other than the sidewall SS is exposed. That is, the protective film PF may be etched to form a sidewall on the sidewall SS. The protective film PF may be etched by a method of selectively etching the protective film PF with respect to the mask film MK. When the protective film PF is formed on the mask film MK to expose the etching film EF at the bottom of the opening OP in Step ST13, Step ST2 may be omitted.

In Step ST3, the etching film EF is etched (see the (e) of FIG. 2). The etching film EF is anisotropically etched by using the mask film MK and the protective film PF formed on the sidewalls SS of the mask film MK as a mask. That is, the etching film EF is anisotropically etched in the depth direction of the opening OP from the portion exposed at the bottom of the opening OP (see the (d) of FIG. 2). During the etching of the etching film EF, a part of the mask film MK may be etched. Further, during the etching of the etching film EF, the protective film PF formed on the sidewall SS of the mask film MK may be trimmed in the width direction of the opening OP.

The etching film EF may be etched by a method of selectively etching the etching film EF with respect to the protective film PF. When the etching film EF is a silicon containing film such as a silicon oxide film or a silicon nitride film, a processing gas used in the etching of the etching film EF may be a fluorocarbon gas and/or a hydrofluorocarbon gas. The fluorocarbon gas is, for example, $CF_4$, $C_4F_6$, or $C_4F_8$.

When the etching film EF is an organic film such as a spin-on-carbon film (SOC) or a photoresist film, the processing gas used in the etching of the etching film EF may be an oxygen containing gas. The oxygen containing gas is, for example, $O_2$, CO, or $CO_2$.

In Step ST4, the mask film MK and the protective film PF are removed (see the (f) of FIG. 2). The mask film MK and the protective film PF are selectively removed with respect to the etching film EF and the underlying film UF. Accordingly, it is possible to obtain the etching film EF in which the dimension of the opening OP is appropriately controlled.

In the present processing method, since the protective film PF is provided on at least a part of the sidewall SS of the mask film MK, the sidewall SS of the mask film MK is protected by the protective film PF in the step of etching the etching film EF. Accordingly, since the shape and/or the dimension of the opening OP can be appropriately maintained in the step of etching the etching film EF, the etching film EF can be appropriately etched. The shape may be the shape of the opening OP in the plan view of the substrate W and/or the shape of the opening OP in a cross-section of the substrate W. For example, in the plan view of the substrate W, when openings OP having a linear shape are formed to be adjacent to one another, the etching film EF can be etched such that intervals between the openings OP are appropriate.

FIG. 5 is a flowchart illustrating another example of the present processing method. Hereinafter, another example of the present processing method will be described along the flowchart illustrated in FIG. 5 with reference to FIG. 2 to FIG. 4. In the example illustrated in FIG. 5, in addition to the example illustrated in FIG. 1, the step of preparing the substrate W (Step ST1) further includes a step of measuring the dimension of the opening OP (Step ST14) and a step of trimming the protective film (Step ST15).

In the present example, after the protective film PF is formed in Step ST13, the dimension of the opening OP is measured in Step ST14. The dimension of the opening OP may be the dimension of the opening OP surrounded by the protective film PF. When the opening OP has a linear shape in the plan view, the dimension may be a dimension of the linear shape in the width direction. For example, in the plan view of the substrate W, when a wiring pattern is formed in which the openings OP having the same-dimension linear shape are repeated, the dimension may be a dimension corresponding to a wiring width or a wiring interval of the wiring pattern. Further, the shape of the opening OP may be measured in Step ST14. The shape of the opening OP may be measured based on the measured dimension of the opening OP. Further, both the dimension and the shape of the opening OP may be measured.

In Step ST14, when the dimension of the opening OP is a given dimension or falls within a given dimension range, the protective film PF is etched in Step ST2. On the other hand, when the dimension of the opening OP is larger than the given dimension or the given dimension range in Step ST14, the process returns to Step ST13, and a protective film PF is additionally formed (that is, the thickness of the protective film PF is increased) to reduce the dimension of the opening OP. Then, in Step ST14, the dimension of the opening OP is measured again, and when the dimension of the opening OP is the given dimension or falls within the given dimension range, the protective film PF is etched in Step ST2. After the process returns to Step ST13 and the protective film PF is additionally formed, the process may shift to Step ST2 to etch the protective film PF without measuring the dimension of the opening OP again in Step ST14.

When the dimension of the opening OP is smaller than the given dimension or the given dimension range in Step ST14, the protective film PF is trimmed (that is, the thickness of the protective film PF is reduced) to increase the dimension of the opening OP in Step ST15. The protective film PF is trimmed by, for example, isotropically etching the protective film PF. Then, in Step ST14, the dimension of the opening OP is measured again, and when the dimension of the opening OP is the given dimension or falls within the given dimension range, the protective film PF is etched in Step ST2. After the protective film PF is trimmed in Step ST15, the process may shift to Step ST2 to etch the protective film PF without measuring the dimension of the opening OP again in Step ST14. In Step ST14, it may be determined whether to additionally form the protective film PF (Step ST13) or trim the protective film PF (Step ST15) based on the measured dimension and/or shape of the opening OP.

When the protective film PF contains boron or phosphorus, a processing gas for trimming the protective film PF may be, for example, a halogen containing gas such as $CF_4$, NF3, $Cl_2$, or $Br_2$. When the protective film PF contains sulfur, the processing gas may be, for example, an oxygen containing gas such as $O_2$, $CO_2$, or NO, a halogen containing gas such as $CF_4$, $NF_3$, $Cl_2$, or $Br_2$, or a hydrogen containing gas such as $H_2$ or HBr. Further, when the protective film PF contains tin, the processing gas may be a gas containing at least one selected from the group consisting of hydrogen, halogen, and carbon such as $H_2$, HBr, HCl, HI, $CH_4$, CO, $CHF_3$, $Cl_2$, and $Br_2$. Regardless of whether the protective film PF contains boron, phosphorus, sulfur, or tin, the processing gas may contain a noble gas such as Ar or an inert gas such as $N_2$.

In the present processing method, the thickness of the protective film PF may be controlled to control the dimension and/or the shape of the opening OP. Accordingly, the dimension and/or the shape of the opening OP formed in the etching film EF can be appropriately controlled. A trimming amount of the protective film PF may be different in the central portion and the peripheral portion of the substrate W in the plan view of the substrate W. For example, the protective film PF may be trimmed in a state where the energy (for example, a temperature or a plasma) in the substrate W is different in the central portion and the peripheral portion. Accordingly, even when the dimension of the opening OP surrounded by the sidewall SS of the mask film MK and/or the dimension of the opening OP surrounded by the protective film PF are different in the central portion and the peripheral portion of the substrate W, a distribution of the trimming amount of the protective film PF may be appropriately controlled to correct the deviation in the dimension.

FIG. 6 is a flowchart illustrating still another example of the present processing method. Hereinafter, still another example of the present processing method will be described along the flowchart illustrated in FIG. 6 with reference to FIG. 2 to FIG. 4. In the example illustrated in FIG. 6, in addition to the example illustrated in FIG. 5, the step of preparing the substrate W (Step ST1) further includes a step of modifying a surface of the protective film (Step ST16).

In the present example, in Step ST13, the carbon containing film or the silicon containing film is formed as the protective film PF. The carbon containing film is, for example, an organic film. Further, the silicon containing film is, for example, a silicon oxide film or a silicon nitride film.

After the dimension of the opening OP is measured in Step ST14 and the thickness of the protective film PF is adjusted in Step ST13 and/or Step ST15 as necessary, at least the surface of the protective film PF is modified in Step ST16 such that the protective film PF contains the protective element more on the surface thereof than in interior thereof. For example, in Step ST16, the surface of the protective film PF reacts with the processing gas containing the protective element to dope the protective film PF with the protective element. Accordingly, the protective element compound is formed on at least the surface of the protective film PF. The surface modification may be performed by, for example, applying energy such as heat or a plasma to the processing gas containing the protective element. Further, the processing gas may be the first processing gas or the second processing gas containing a boron containing substance, a phosphorus containing substance, a sulfur containing substance, or a tin containing substance. Further, a condition for causing the protective film PF to react with the processing gas may be adjusted to selectively modify the protective film PF on the sidewall SS of the mask film MK.

In the present processing method, since the protective element compound is formed on at least the surface of the protective film PF after the carbon containing film or the silicon containing film is formed as the protective film PF, the thickness of the protective film PF can be controlled. Accordingly, the dimension of the opening OP formed in the protective film PF can be appropriately controlled.

The above embodiments are described for the purpose of illustration, and various modifications may be made without departing from the scope and idea of the present disclosure. For example, the present processing method can be executed by using a substrate processing apparatus using any plasma source, such as an inductively-coupled plasma or a microwave plasma, in addition to the capacitively-coupled substrate processing apparatus 1.

REFERENCE SIGNS LIST 1 substrate processing apparatus, 10 plasma processing chamber, 11 substrate support, 13 shower head, 20 gas supply, 21 gas source, 22 flow rate controller, 30 power source, 31 RF power source, 32 DC power source, 40 exhaust system, 50 controller, 111 main body, 112 ring assembly, EF etching film, LLM load lock module, LM loader module, LP load port, MK mask film, OP opening, PF protective film, PM substrate processing module, PS substrate processing system, SS sidewall, TM transfer module, UF underlying film, W substrate

The invention claimed is:

1. A substrate processing method, comprising:

preparing a substrate having (a) an etching film, (b) a mask film formed on the etching film and having a sidewall that defines an opening on the etching film, and (c) a protective film formed to surround the opening on the sidewall of the mask film and containing an element selected from the group consisting of boron, phosphorus, sulfur, and tin, wherein the preparing the substrate includes:

forming the protective film;

measuring one or both of a dimension and a shape of the opening surrounded by the protective film; and trimming a thickness of a portion of the protective film formed on the sidewall based on one or both of the dimension and the shape; and etching the etching film by using the protective film and the mask film as a mask.

2. The substrate processing method according to claim 1, wherein the preparing the substrate further includes measuring one or both of the dimension and the shape of the opening surrounded by the trimmed protective film.

3. The substrate processing method according to claim 2, wherein the preparing the substrate further includes one of the forming the protective film and the trimming based on one or both of the dimension and the shape of the opening surrounded by the trimmed protective film.

4. The substrate processing method according to claim 1, wherein the forming the protective film includes forming a precursor layer on the sidewall of the mask film by using a first processing gas, and forming the protective film from the precursor layer by using a second processing gas, and the first processing gas or the second processing gas contains the element.

5. The substrate processing method according to claim 1, wherein the preparing the substrate includes forming the protective film by a CVD method.

6. The substrate processing method according to claim 1, wherein the preparing the substrate further includes modifying the protective film such that the protective film contains the element more on a surface of the protective film than in an interior of the protective film.

7. The substrate processing method according to claim 6, wherein the modifying the protective film includes causing the surface of the protective film to react with a processing gas containing the element to convert the surface of the protective film into a film containing the element or a film containing a compound containing the element.

8. The substrate processing method according to claim 7, wherein the forming the protective film includes forming a carbon containing film or a silicon containing film as the protective film, and the modifying the protective film includes causing a surface of the carbon containing film or the silicon containing film to react with the processing gas containing the element to convert the carbon containing film or the silicon containing film into the film containing the element or the film containing the compound containing the element.

9. The substrate processing method according to claim 7, wherein the compound containing the element is boron oxide, boron nitride, boron carbide, silicon boride, or an organic boron compound.

10. The substrate processing method according to claim 7, wherein the compound containing the element is phosphoric acid, polyphosphoric acid, a phosphate salt, a phosphate ester, a phosphorus oxide, or a phosphorus nitride.

11. The substrate processing method according to claim 7, wherein the compound containing the element is a tin oxide, a tin nitride, a tin phosphide, a tin sulfide, or a tin halide.

12. The substrate processing method according to claim 1, wherein the opening has a hole shape or a linear shape in a plan view of the substrate.

13. The substrate processing method according to claim 1, wherein the preparing the substrate includes modifying the protective film such that the trimmed protective film contains the element more on a surface of the protective film than in an interior of the protective film.

14. The substrate processing method according to claim 13, wherein the modifying the protective film includes causing the surface of the trimmed protective film to react with a processing gas containing the element to convert the surface of the trimmed protective film into a film containing the element or a film containing a compound containing the element.

* * * * *